United States Patent
He et al.

(10) Patent No.: US 9,041,094 B2
(45) Date of Patent: May 26, 2015

(54) FINFET FORMED OVER DIELECTRIC

(71) Applicant: INTERNATIONAL BUSINESS MACHINES CORPORATION, Armonk, NY (US)

(72) Inventors: Hong He, Schenectady, NY (US); Chiahsun Tseng, Wynantskill, NY (US); Chun-Chen Yeh, Clifton Park, NY (US); Yunpeng Yin, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/035,313

(22) Filed: Sep. 24, 2013

(65) Prior Publication Data
US 2015/0054121 A1   Feb. 26, 2015

Related U.S. Application Data

(63) Continuation of application No. 13/972,032, filed on Aug. 21, 2013.

(51) Int. Cl.
*H01L 29/772* (2006.01)
*H01L 29/06* (2006.01)

(52) U.S. Cl.
CPC ................. *H01L 29/0649* (2013.01)

(58) Field of Classification Search
USPC ................................................ 257/327, 544
See application file for complete search history.

(56) References Cited

U.S. PATENT DOCUMENTS

| | | | |
|---|---|---|---|
| 6,642,090 B1 | 11/2003 | Fried et al. | |
| 6,960,509 B1 * | 11/2005 | Han et al. | 438/283 |
| 7,101,763 B1 | 9/2006 | Anderson et al. | |
| 7,320,908 B2 * | 1/2008 | Son et al. | 438/175 |
| 7,531,393 B2 | 5/2009 | Doyle et al. | |
| 7,820,551 B2 * | 10/2010 | Yagishita et al. | 438/700 |
| 7,879,677 B2 * | 2/2011 | Lee | 438/283 |
| 7,993,999 B2 | 8/2011 | Basker et al. | |
| 8,048,723 B2 * | 11/2011 | Chang et al. | 438/135 |
| 8,426,283 B1 * | 4/2013 | Wang et al. | 438/299 |
| 2007/0221956 A1 * | 9/2007 | Inaba | 257/197 |
| 2008/0001171 A1 * | 1/2008 | Tezuka et al. | 257/191 |
| 2009/0278196 A1 * | 11/2009 | Chang et al. | 257/328 |
| 2010/0144121 A1 * | 6/2010 | Chang et al. | 438/478 |
| 2010/0163971 A1 * | 7/2010 | Hung et al. | 257/327 |
| 2010/0213548 A1 * | 8/2010 | Chang et al. | 257/348 |

(Continued)

OTHER PUBLICATIONS

Bu, H. "Finfet Technology a Substrate Perspective" 2011 IEEE International SOI Conference. Oct. 2011. (27 Pages).

(Continued)

*Primary Examiner* — Earl Taylor
(74) *Attorney, Agent, or Firm* — Tutunjian & Bitetto, P.C.; Vazken Alexanian

(57) ABSTRACT

A method for semiconductor fabrication includes patterning one or more mandrels over a semiconductor substrate, the one or more mandrels having dielectric material formed therebetween. A semiconductor layer is formed over exposed portions of the one or more mandrels. A thermal oxidation is performed to diffuse elements from the semiconductor layer into an upper portion of the one or more mandrels and concurrently oxidize a lower portion of the one or more mandrels to form the one or more mandrels on the dielectric material.

15 Claims, 10 Drawing Sheets

(56) References Cited

U.S. PATENT DOCUMENTS

| | | | |
|---|---|---|---|
| 2011/0037129 A1* | 2/2011 | Yu et al. | 257/401 |
| 2011/0193141 A1* | 8/2011 | Lin et al. | 257/255 |
| 2012/0091528 A1 | 4/2012 | Chang et al. | |
| 2012/0280289 A1 | 11/2012 | Flachowsky et al. | |
| 2013/0005103 A1 | 1/2013 | Liu et al. | |

OTHER PUBLICATIONS

Smith, C., et al. "Dual Channel Finfets As a Single High-K/Metal Gate Solution Beyond 22NM Node" 2009 IEEE International Electron Devices Meeting. Dec. 2009. (4 Pages).

* cited by examiner

FINFET FORMED OVER DIELECTRIC

RELATED APPLICATION DATA

This application is a Continuation application of co-pending U.S. patent application Ser. No. 13/972,032 filed on Aug. 21, 2013, incorporated herein by reference in its entirety.

BACKGROUND

1. Technical Field

The present invention relates to semiconductor fabrication, and more particularly to the formation of silicon germanium fins and bottom dielectric isolation together.

2. Description of the Related Art

Current techniques for forming pFET (p-type field effect transistor) silicon germanium fins include forming a silicon well in the pFET region, growing silicon germanium, and then forming fins from the silicon germanium through advanced patterning techniques. However, one challenge of this approach is the high germanium concentration in the silicon germanium epitaxial growth. When germanium concentration is too high, it can result in defects and may also lose epitaxial growth selectivity. Another challenge is that the current techniques require sufficient spacing between silicon fins (e.g., in the n-type field effect transistor region) and silicon germanium fins (e.g., in the pFET region) so that the fins formed close to the boundary between them can be cut off in later processing. This requirement adds to cell density and causes an increase in area without any performance benefit, such as, e.g., reduced current drive per footprint.

SUMMARY

A method for semiconductor fabrication includes patterning one or more mandrels over a semiconductor substrate, the one or more mandrels having dielectric material formed therebetween. A semiconductor layer is formed over exposed portions of the one or more mandrels. A thermal oxidation is performed to diffuse elements from the semiconductor layer into an upper portion of the one or more mandrels and concurrently oxidize a lower portion of the one or more mandrels to form the one or more mandrels on the dielectric material.

A method for semiconductor fabrication includes patterning one or more mandrels over a silicon substrate, the one or more mandrels having a mask layer thereon from the patterning and dielectric material formed therebetween. The dielectric material is recessed to expose the one or more mandrels. A germanium containing layer is formed over exposed portions of the one or more mandrels. Gaps between the one or more mandrels are filled with dielectric material. A thermal oxidation is performed to diffuse germanium from the germanium containing layer into an upper portion of the one or more mandrels and concurrently oxidize a lower portion of the one or more mandrels to form the one or more silicon germanium mandrels on the dielectric material. The dielectric material is selectively removed to expose the silicon germanium mandrels on the dielectric material.

A semiconductor device includes a dielectric layer formed over a semiconductor substrate and one or more mandrels formed over the dielectric layer. The one or more mandrels have a triangular shaped bottom end.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
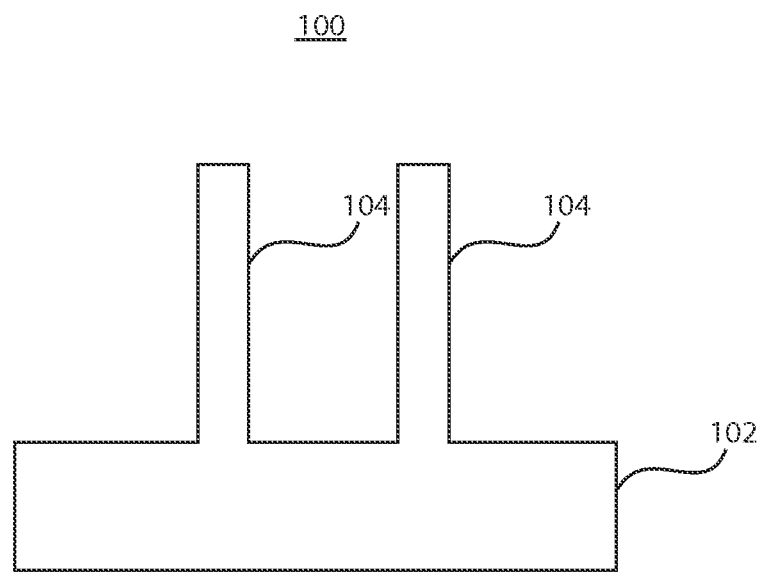
FIG. 1 is a cross-sectional view of a semiconductor device having a substrate and mandrels formed thereon, in accordance with one illustrative embodiment.

In accordance with the present principles, a semiconductor device and methods of formation of the semiconductor device are provided. Mandrels are patterned from a semiconductor substrate. The mandrels may include masks from the lithographic mandrel patterning process. Dielectric material is filled between the mandrels and then recessed to expose the mandrels. A germanium containing layer is conformally formed around exposed portions of the mandrels. In one embodiment, the germanium containing layer may include a monocrystalline layer. In other embodiments, the germanium containing layer may include a polycrystalline layer or amorphous layer. Dielectric material is filled in the gaps between the mandrels. A high-temperature thermal oxidation is performed to diffuse in the germanium into the upper portions of the silicon mandrels to form silicon germanium mandrels and oxidize the lower portions of the mandrels to realize the bottom dielectric isolation. Advantageously, silicon germanium fins and a bottom dielectric isolation layer are formed together.

It is to be understood that the present invention will be described in terms of a given illustrative architecture having a wafer; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a semiconductor device 100 is shown having a semiconductor substrate 102 with mandrels 104 formed thereon. The substrate 102 may include a bulk silicon, germanium, gallium, arsenide, semiconductor on insulator (SOI) or any other substrate material or combination of materials. In some embodiments, the substrate 102 further comprises other features or structures that are formed on or in the semiconductor substrate in previous process steps.

Mandrels 104 are formed from the substrate 102. Formation of the mandrels 104 may include a lithographic process to form a mask layer (not shown) and etch exposed portions of the substrate 102 to form mandrels 104. The mandrels 104 are shown having the mask layer from the lithographic mandrel patterning step removed. However, in one embodiment, the mask layer from the lithographic mandrel patterning step may remain over the mandrels 104. This will be discussed below with respect to FIGS. 13-16. In some embodiments, the mandrels 104 may include fin structures.

Figure 2:
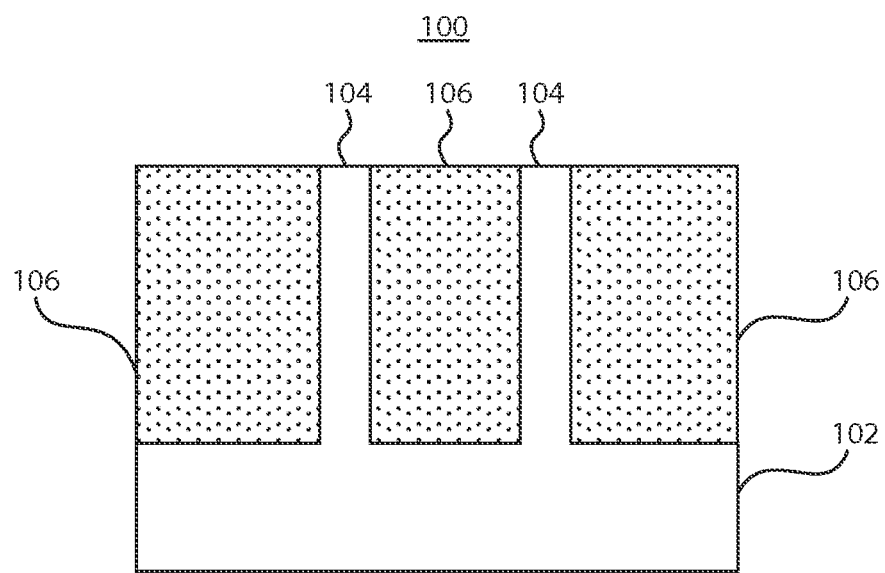
FIG. 2 is a cross-sectional view of a semiconductor device having dielectric regions formed between mandrels, in accordance with one illustrative embodiment.

Referring now to FIG. 2, the processing of the semiconductor device 100 continues to form shallow trench isolation (STI) regions 106. STI regions 106 provide electrical isolation between devices to reduce parasitic currents and the like therebetween. STI regions 106 may include an oxide, e.g., a silicon oxide.

Figure 3:
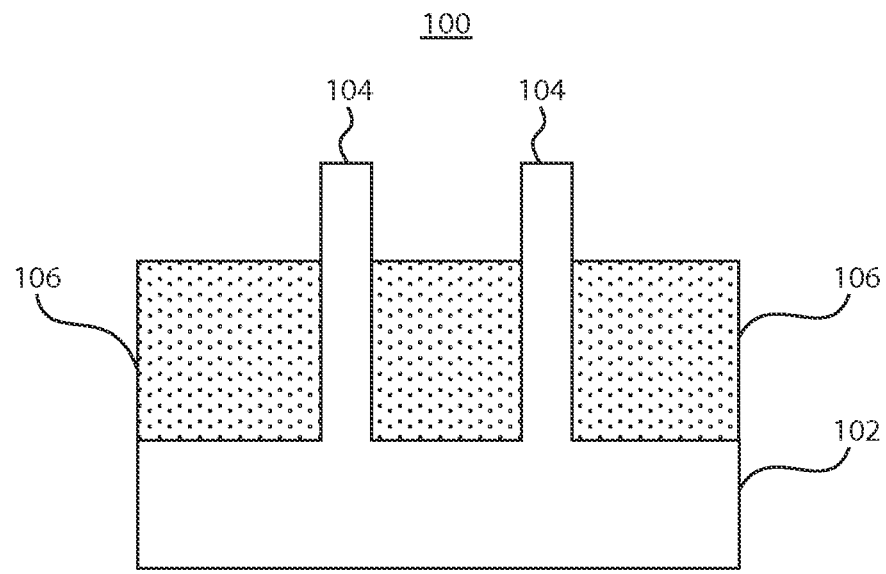
FIG. 3 is a cross-sectional view of a semiconductor device having dielectric regions recessed to expose a portion of the mandrels, in accordance with one illustrative embodiment.

Referring now to FIG. 3, STI regions 106 on the device 100 are recessed. This may include etching STI regions 106 such that mandrels 104 remain. Etching may include, e.g., an isotropic etch, anisotropic etch, etc. The etch is preferably selective to the mandrels 104 to remove portions of the STI regions 106 and expose mandrels 104. STI regions 106 are preferably recessed to a depth of about, e.g., 30 nm from the top surface of the mandrels 104.

Figure 4:
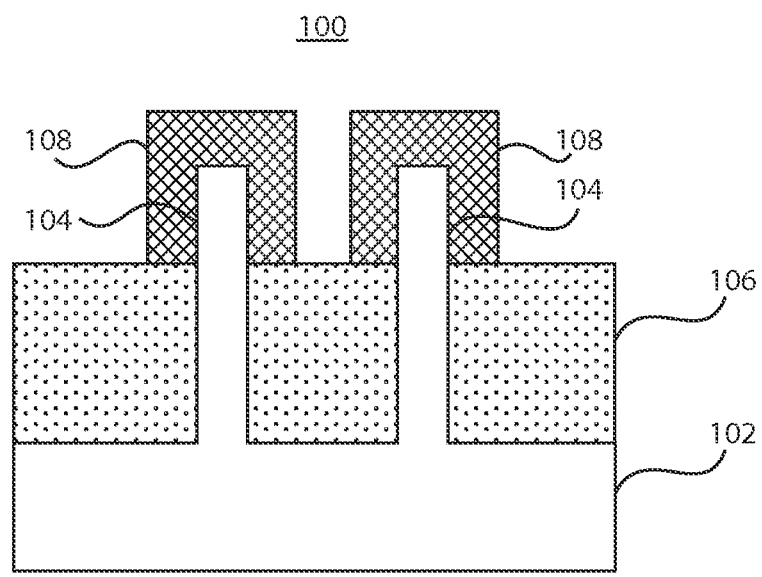
FIG. 4 is a cross-sectional view of a semiconductor device having a germanium containing layer formed on exposed surfaces of the mandrels, in accordance with one illustrative embodiment.

Referring now to FIG. 4, a semiconductor layer 108 is conformally formed over mandrels 104. The semiconductor layer 108 includes a monocrystalline epitaxial layer or film. Preferably, the semiconductor layer 108 is a germanium containing layer, such as, e.g., a high concentration germanium or silicon germanium layer, or any other germanium containing layer having a thickness of about, e.g., 20-30 nm. The germanium containing layer 108 is deposited and epitaxially grown such that the germanium containing layer 108 is conformally formed over exposed surfaces of the mandrels 104, which include the sidewalls and top portions. As the germanium containing layer 108 is a monocrystalline epitaxial layer which grows on silicon, the germanium containing layer 108 is not formed over STI regions 106

Figure 5:
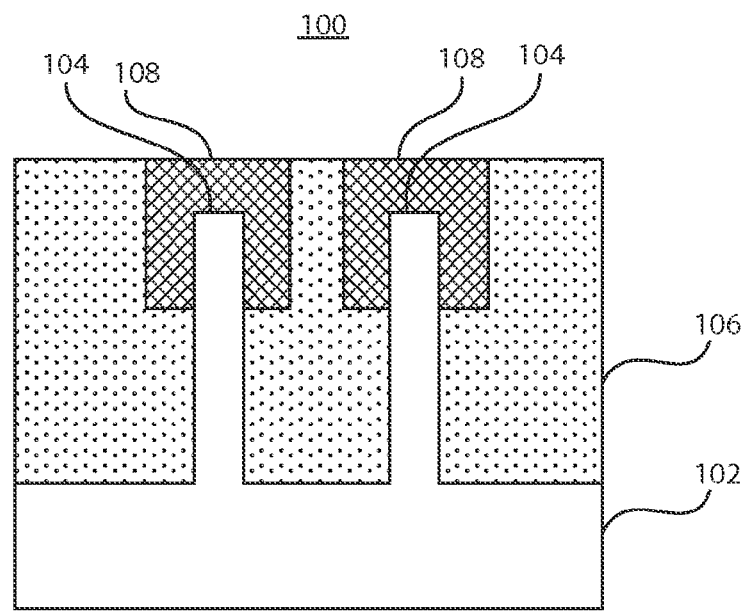
FIG. 5 is a cross-sectional view of a semiconductor device having dielectric regions formed in gaps between the mandrels, in accordance with one illustrative embodiment.

Referring now to FIG. 5, a local STI fill and polish are employed to fill in the gaps between mandrels 104 having germanium containing layer 108 formed thereon. The STI fill may include an oxide, e.g., a silicon oxide. The STI fill is preferably the same material as STI regions 106. The STI regions 106 are preferably filled and polished at least to the top surface of the germanium layer 108, but may also be higher or lower than the top surface of the germanium layer 108.

Figure 6:
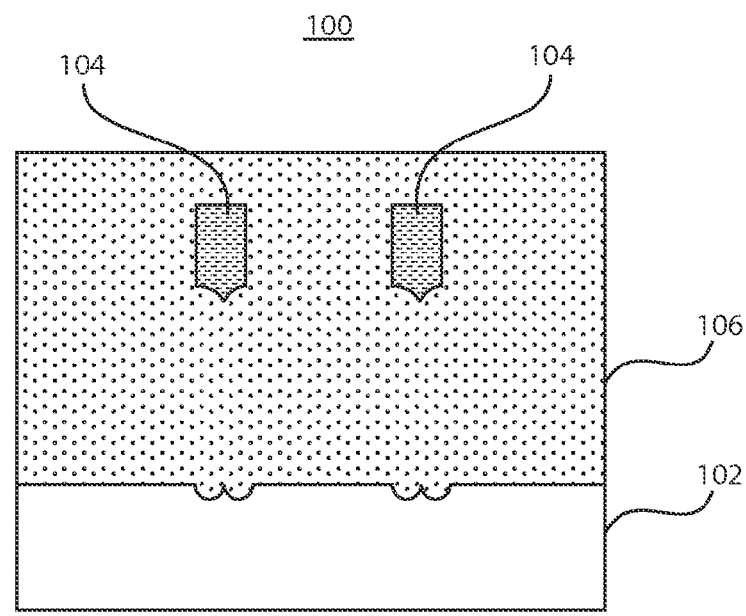
FIG. 6 is a cross-sectional view of a semiconductor device after a high-temperature thermal oxidation is performed, in accordance with one illustrative embodiment.

Referring now to FIG. 6, a high temperature thermal oxidation is performed on the device 100. The high temperature thermal oxidation is preferably performed at a temperature of about, e.g., 800-1200 degrees Celsius. As a result of the high temperature thermal oxidation, germanium from the germanium containing layer 108 in contact with the mandrels 104 diffuses into the upper portions of mandrels 104 to form silicon germanium mandrels 104. Additionally, lower portions of the mandrels 104 oxidize to form a dielectric isolation material as part of the STI regions 106.

Figure 7:
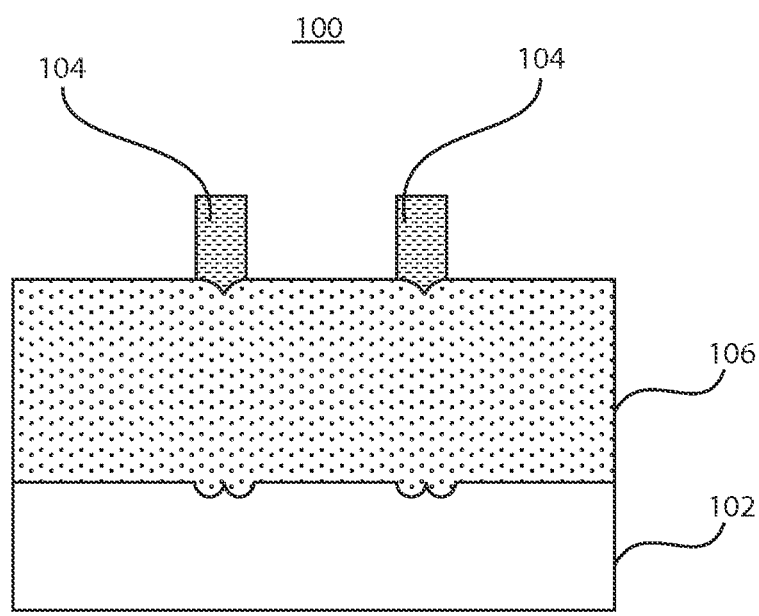
FIG. 7 is a cross-sectional view of a semiconductor device having silicon germanium mandrels and bottom dielectric isolation formed together, in accordance with one illustrative embodiment.

Referring now to FIG. 7, the device 100 is selectively etched to expose the upper portions of the mandrels 104. The etch (e.g., isotropic etch, anisotropic etch, etc.) is selective to remove portions of STI regions 106 such that silicon germanium mandrels 104 remain. STI regions 106 are preferably recessed to a depth of about, e.g., 30 nm from the top surface of the mandrels 104. However, other depths may also be employed in accordance with a desired fin height for later processing steps. Uniquely, the mandrels 104 have a triangular shaped bottom portion extending into the STI regions 106 due to the high temperature thermal oxidation. Additionally, semicircular shaped portions of dielectric material extend into the substrate 102 due to the oxidation of the lower portions of the mandrels 104.

Advantageously, the device 100 includes silicon germanium fins 104 and bottom dielectric isolation 106 formed together. The device 100 is formed by applying a high temperature thermal oxidation to diffuse germanium from a monocrystalline germanium containing layer to form silicon germanium fins over a bottom dielectric region.

Figure 8:
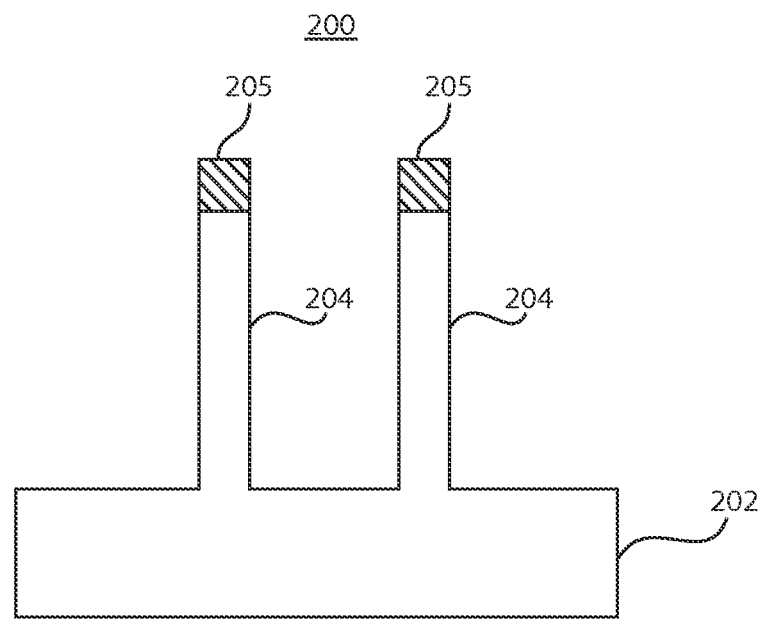
FIG. 8 is a cross-sectional view of a semiconductor device having a substrate and mandrels with a mask layer formed thereon, in accordance with one illustrative embodiment.

In a second embodiment, a semiconductor device having silicon germanium fins and bottom dielectric isolation formed together by diffusing germanium from a polysilicon or amorphous germanium containing layers. Referring now to FIG. 8, a semiconductor device 200 is shown having a substrate 202 and mandrels 204 formed thereon. Formation of the mandrels 204 may include a lithographic process to form a mask layer 205 and etch exposed portions of the substrate 202 to form mandrels 204. In one embodiment, the mask layer 205 from the lithographic mandrel patterning process remains over the mandrels 204. The mask layer 205 may include, e.g., silicon nitride (SiN), however other suitable material may also be employed. In other embodiments, the mask layer 205 may be removed.

Figure 9:
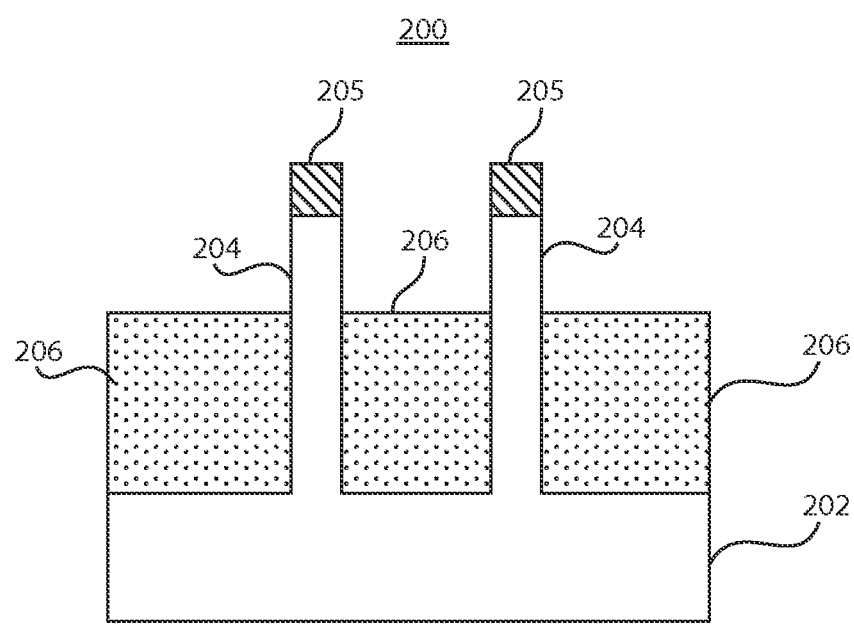
FIG. 9 is a cross-sectional view of a semiconductor device having recessed dielectric regions formed between mandrels, in accordance with one illustrative embodiment.

Referring now to FIG. 9, STI regions 206 are formed between the mandrels 204. STI regions 206 may include an oxide, e.g., a silicon oxide. STI regions 206 are recessed by etching to expose portions of the mandrels 204.

Figure 10:
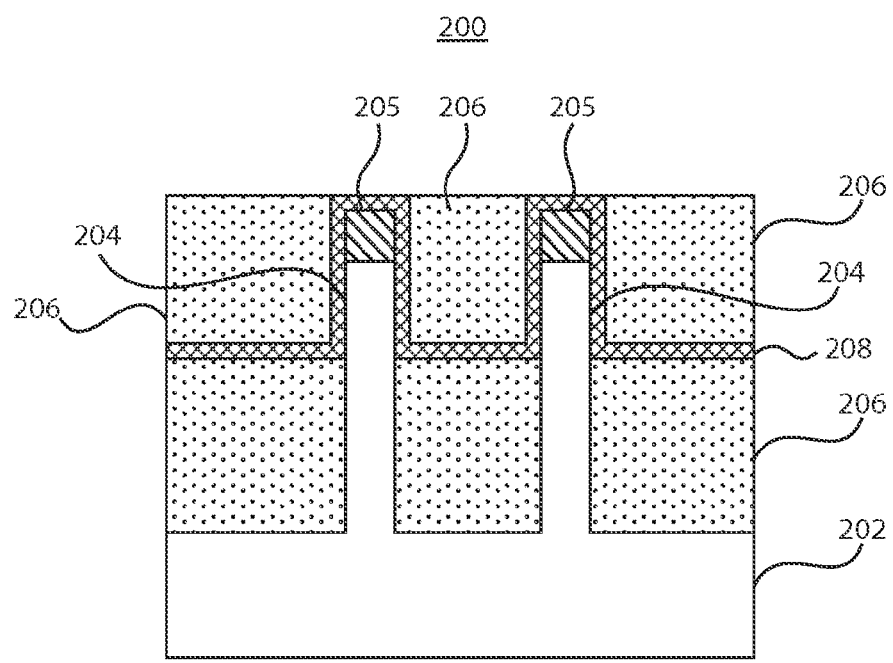
FIG. 10 is a cross-sectional view of a semiconductor device having a germanium containing layer formed on exposed surfaces of the mandrels and dielectric regions formed in gaps between the mandrels, in accordance with one illustrative embodiment.

Referring now to FIG. 10, a semiconductor layer 208 is conformally formed over the surface of the device 200. The semiconductor layer 208 includes a polycrystalline or amorphous layer or film. Preferably, the semiconductor layer 208 is a germanium containing layer (e.g., high concentration germanium, silicon germanium, etc.) having a thickness of about, e.g., 20-30 nm. The germanium containing layer 208 is deposited over exposed surfaces of the device 200 such that the germanium containing layer 208 is conformally formed over the STI region 206, mandrels 204 and mask 205. In one embodiment, where the mask 205 is removed, the germanium containing layer 208 is formed over exposed surfaces of the mandrels 204, including sidewalls and the top portion. A local STI fill and polish are employed to fill in the gaps between mandrels 204. The STI fill is preferably the same material as STI regions 206.

Figure 11:
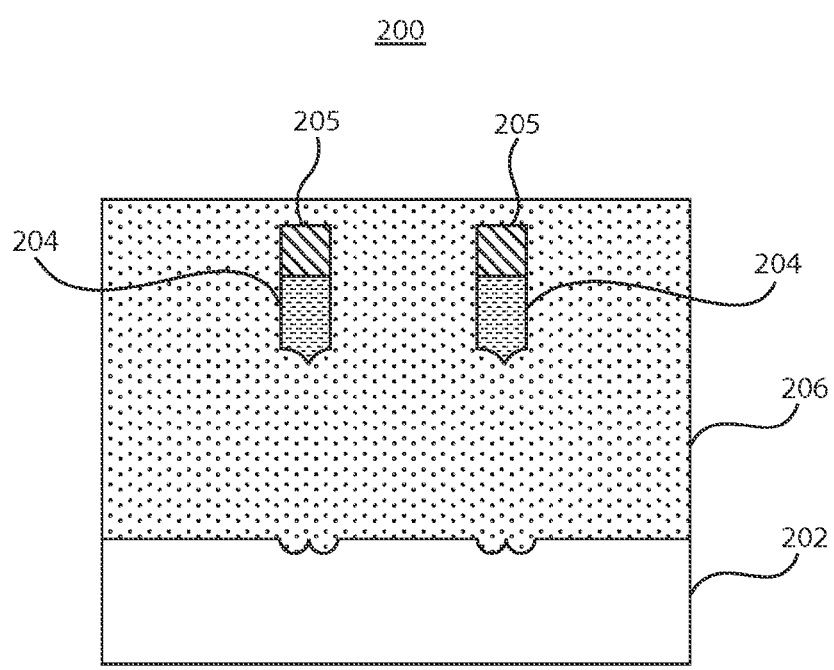
FIG. 11 is a cross-sectional view of a semiconductor device after a high-temperature thermal oxidation is performed, in accordance with one illustrative embodiment.

Referring now to FIG. 11, a high-temperature thermal oxidation is performed on device 200. As a result, germanium from the germanium containing layer 208 in contact with the mandrels 204 diffuses into the upper portions of the mandrels 204 through the sidewalls (and also through the top where the mask 205 is removed) to form silicon germanium mandrels 204. Germanium also diffuses into the STI regions 206, however this does not significantly affect the STI regions 206. Lower portions of the mandrels 204 oxidize to form a dielectric isolation material as part of the STI regions 206.

Figure 12:
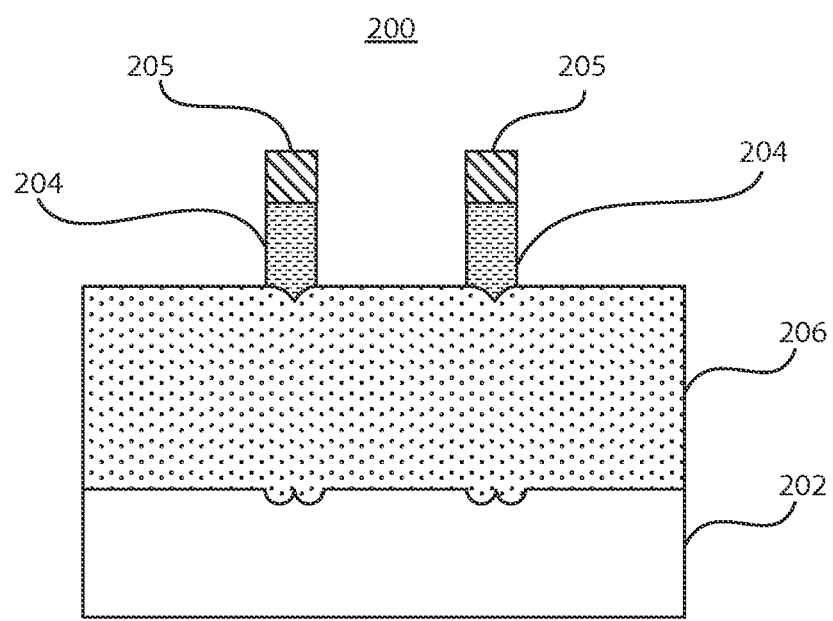
FIG. 12 is a cross-sectional view of a semiconductor device having silicon germanium mandrels with a mask layer thereon and bottom dielectric isolation formed together, in accordance with one illustrative embodiment.

Referring now to FIG. 12, the device 200 is selectively etched to expose the upper portions of the mandrels 204 with mask layer 205. The etch is selective to remove portions of STI regions 206 such that silicon germanium mandrels 204 remain. STI regions 206 are preferably recessed to a depth of about, e.g., 30 nm from the top surface of the mask 205 (or mandrels 204 where the mask 205 is removed).

The device 200 includes silicon germanium fins 204 having masks 205 thereon and bottom dielectric isolation 206 formed together. The device 200 is formed by applying a high temperature thermal oxidation to diffuse germanium from a polycrystalline or amorphous germanium containing layer to form silicon germanium fins (with or without masks formed thereon) over a bottom dielectric region.

Figure 13:
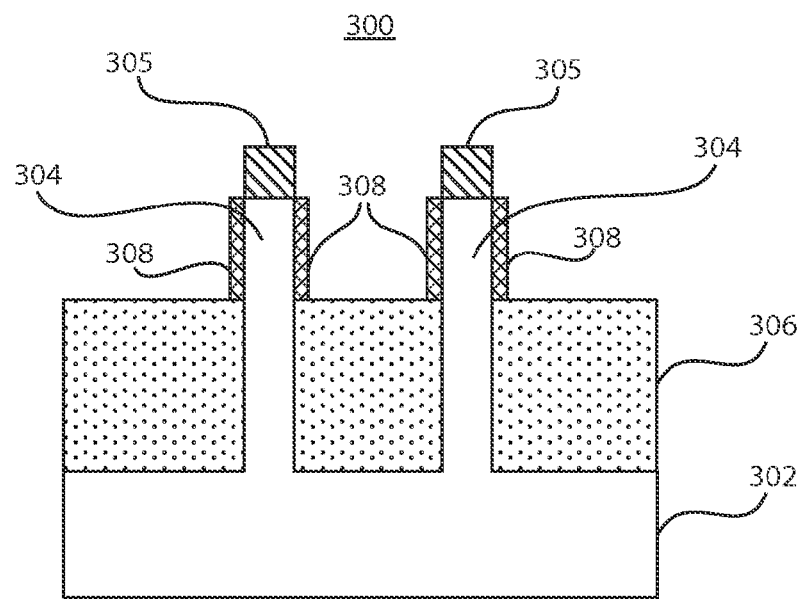
FIG. 13 is a cross-sectional view of a semiconductor device having a germanium containing layer formed on exposed portions of the mandrels, in accordance with one illustrative embodiment.

In another embodiment, a silicon germanium fin having a mask thereon is formed together over a bottom dielectric isolation by diffusing germanium from a monocrystalline film. Referring now to FIG. 13, a semiconductor device 300 is shown. Similar processing steps as shown in FIGS. 8 and 9 are performed to form a substrate 302 having mandrels 304 formed thereon. Mandrels 304 are formed by a lithographic mandrel patterning process to form a mask layer 305 and etch exposed portions of the substrate 302 to form mandrels 304. The mask layer 305 preferably remains over the mandrels 304 from the lithographic mandrel patterning process.

STI regions 306 (e.g., oxide) are formed between the mandrels 304 and recessed by etching to expose portions of the mandrels 304. A semiconductor layer 308 is conformally formed over exposed surfaces of the mandrels 304. The semiconductor layer 304 includes a monocrystalline epitaxial layer or film. Preferably, the semiconductor layer 308 is a germanium containing layer (e.g., high concentration germanium, silicon germanium, etc.) which may be epitaxially grown over exposed portions of silicon.

Figure 14:
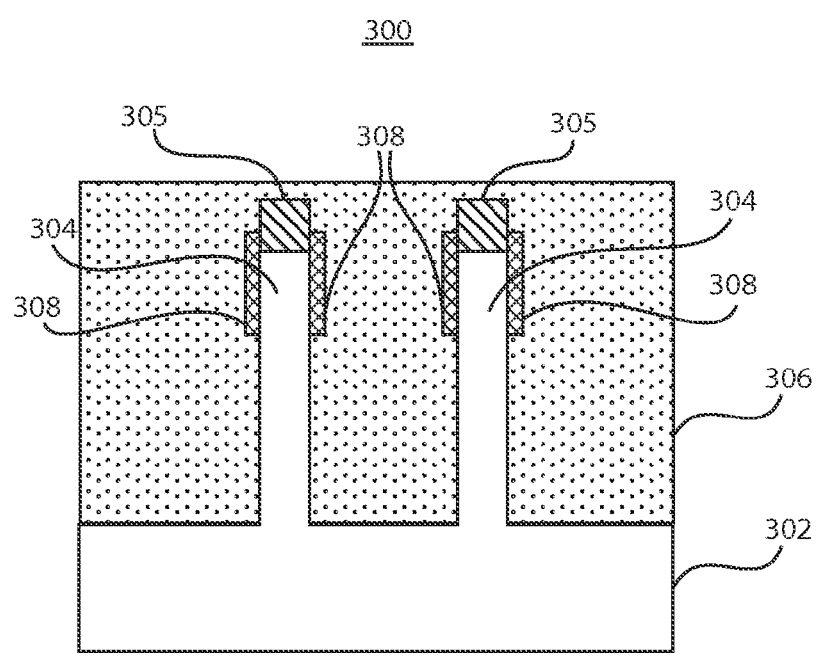
FIG. 14 is a cross-sectional view of a semiconductor device having dielectric regions formed in gaps between the mandrels, in accordance with one illustrative embodiment.

Referring now to FIG. 14, a local STI fill and polish are employed to fill in the gaps between the mandrels 304. The STI fill is preferably the same material as STI regions 306.

Figure 15:
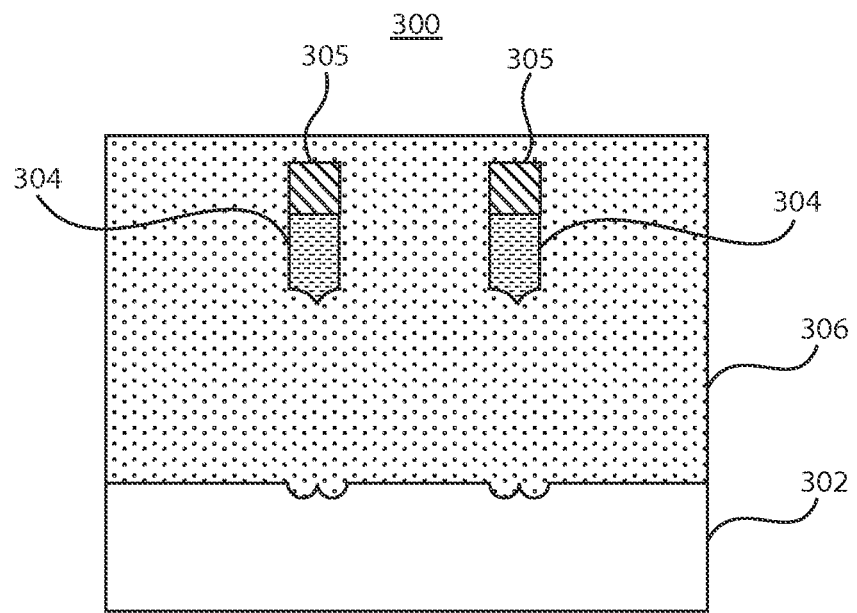
FIG. 15 is a cross-sectional view of a semiconductor device after a high-temperature thermal oxidation is performed, in accordance with one illustrative embodiment.

Referring now to FIG. 15, a high-temperature thermal oxidation is performed on the device 300. As a result, germanium from the germanium containing layer 308 in contact with the mandrels 304 diffuses into the upper portions of the mandrels 304 to form silicon germanium mandrels 304. Lower portions of the mandrels 304 oxidize to form a dielectric isolation material as part of the STI regions 306.

Figure 16:
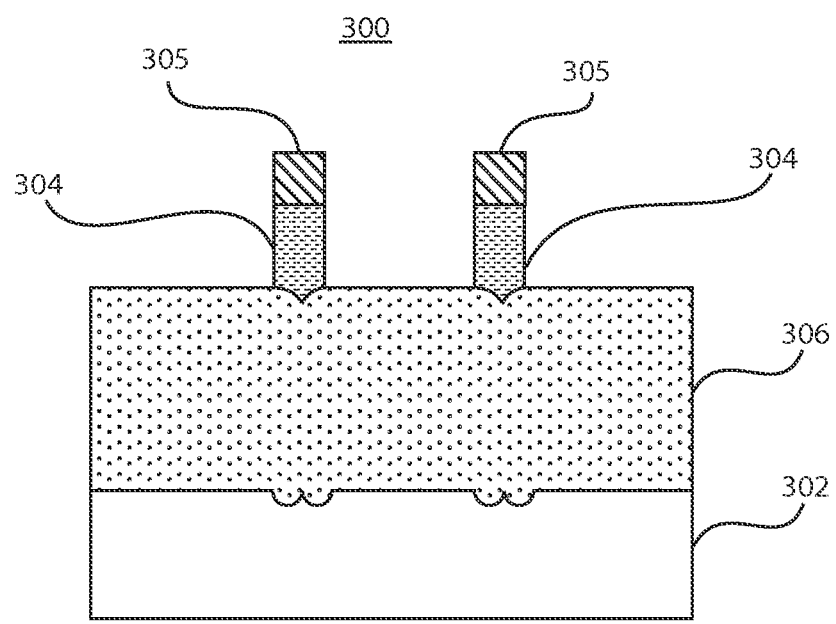
FIG. 16 is a cross-sectional view of a semiconductor device having silicon germanium mandrels with a mask layer formed thereon and bottom dielectric isolation formed together, in accordance with one illustrative embodiment.

Referring now to FIG. 16, the device 300 is selectively etched to expose the upper portions of the mandrels 304 with mask layer 305. The etch is selective to remove portions of STI regions 306 such that silicon germanium mandrels 304 remain. STI regions 306 are preferably recessed to a depth of about, e.g., 30 nm from the top surface of the mask 306.

The device 300 includes silicon germanium fins 304 having masks 305 thereon and bottom dielectric isolation 306 formed together. The device 300 is formed by applying a high temperature thermal oxidation to diffuse germanium from a monocrystalline germanium containing layer to form silicon germanium fins with masks thereon over a bottom dielectric region.

Figure 17:
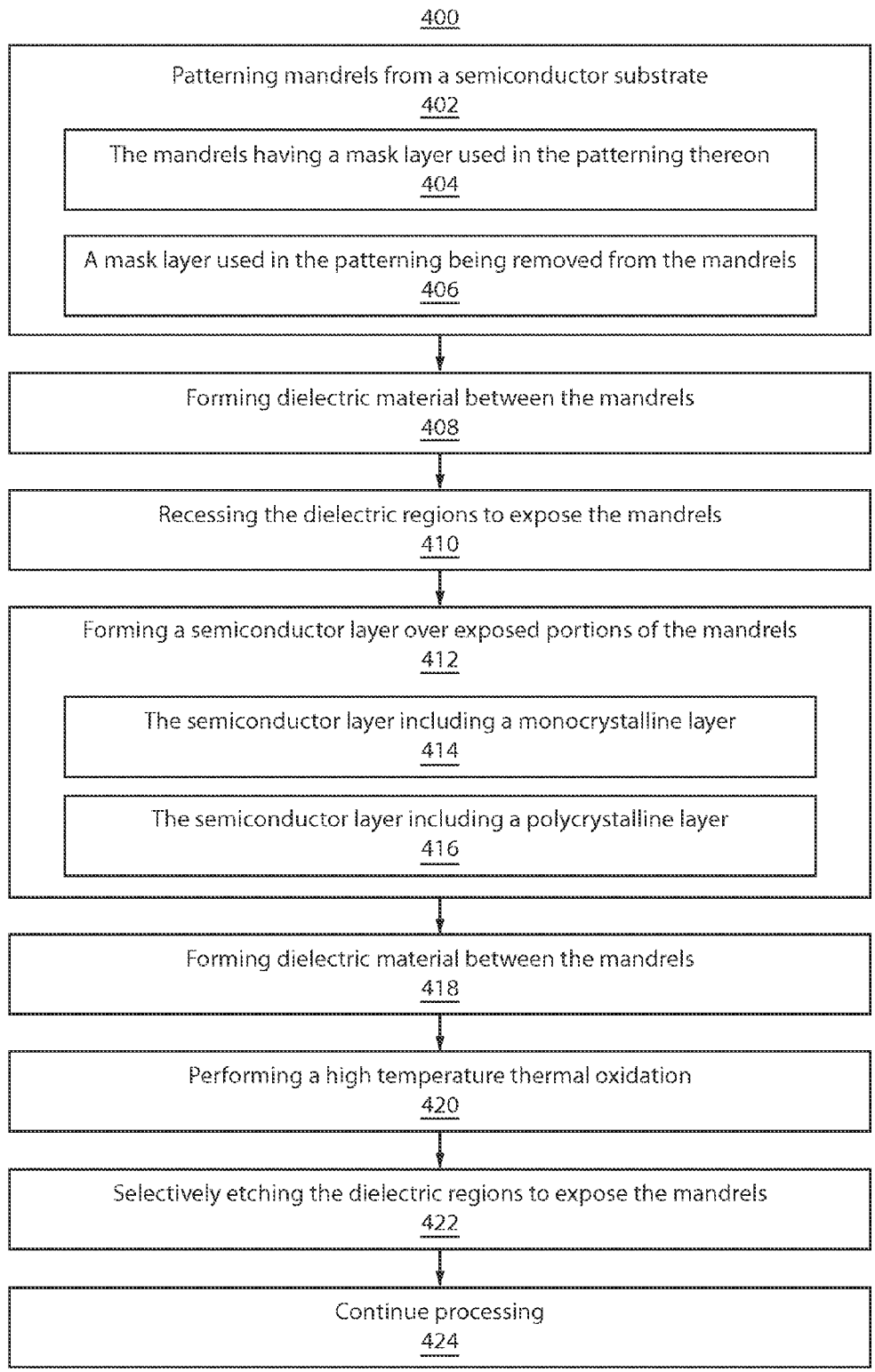
FIG. 17 is a block/flow diagram showing a system/method for semiconductor fabrication, in accordance with one illustrative embodiment.

Referring now to FIG. 17, a block/flow diagram showing a method 400 for semiconductor fabrication is shown in accordance with one illustrative embodiment. In block 402, one or more mandrels are patterned over a semiconductor substrate. The one or more mandrels may include one or more fin structures. The one or more mandrels may be formed by a lithographic involving applying a mask layer (e.g., SiN) and etching unprotected portions to form the one or more mandrels. In block 404, in one embodiment, the mask layer from the lithographic process remains over the one or more mandrels. In block 406, in another embodiment, the mask layer from the lithographic process is removed from the one or more mandrels.

In block 408, dielectric regions are formed between the one or more mandrels. The dielectric regions may include, e.g., an oxide. In block 410, the dielectric regions are recessed (e.g., by etching) to expose the one or more mandrels. In block 412, a semiconductor layer is formed over exposed portions of the one or more mandrels. The semiconductor layer preferably includes germanium, such as, e.g., a high concentration germanium layer, a silicon germanium layer, etc. In block 414, in one embodiment, the semiconductor layer includes a monocrystalline epitaxial layer which grows on exposed surfaces of the one or more mandrels. In block 416, in another embodiment, the semiconductor layer includes a polycrystalline or amorphous layer, which is deposited over exposed surfaces of the semiconductor device.

In block 418, dielectric material is formed between gaps of the one or more mandrels. In block 420, a high-temperature thermal oxidation is performed to diffuse germanium from the semiconductor layer into an upper portion of the one or more mandrels and oxidize a lower portion of the one or more mandrels into a dielectric material. In block 422, the dielectric material is selectively etched to expose the one or more mandrels formed over the dielectric material. In block 424, processing may continue to, e.g., form devices, etc.

Having described preferred embodiments of a system and method for a finFET formed over dielectric (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device, comprising:
a substantially planar semiconductor substrate having a semicircular recess with a centrally positioned peak into a planar upper surface of the semiconductor planar semiconductor substrate;
a dielectric layer present on the semiconductor substrate and filling said at least one recess; and
one or more mandrels formed over the dielectric layer, the one or more mandrels having a triangular shaped bottom end having an apex that is substantially aligned with the centrally positioned peak of the semicircular recess in the semiconductor substrate.

2. The semiconductor device as recited in claim 1, wherein the triangular shaped bottom end extends into the dielectric layer.

3. The semiconductor device as recited in claim 1, wherein the one or more mandrels include one or more silicon germanium mandrels.

4. The semiconductor device as recited in claim 1, further comprising a mask layer formed over the one or more mandrels.

5. The semiconductor device as recited in claim 1, wherein the one or more mandrels include one or more fins.

6. A semiconductor device, comprising:
a dielectric layer formed over a substantially planar semiconductor substrate, the substantially planar semiconductor substrate having a semicircular recess with a centrally positioned peak into a planar upper surface of the substantially planar semiconductor substrate; and
one or more mandrels comprised of silicon germanium formed over the dielectric layer, the one or more mandrels having a triangular shaped bottom end extending into the dielectric layer, wherein the triangular shaped bottom end is substantially aligned with the semicircular recess with a centrally positioned peak in the planar upper surface of the substantially planar semiconductor substrate.

7. The semiconductor device of claim 1, wherein the semiconductor substrate is comprised of bulk silicon, germanium, gallium, arsenide, semiconductor on insulator (SOI) or a combination thereof.

8. The semiconductor device of claim 1, wherein the dielectric layer is comprised of silicon oxide.

9. The semiconductor device of claim 1, wherein the dielectric layer has a thickness of 20 nm or less.

10. The semiconductor device as recited in claim 6, wherein the one or more mandrels include one or more silicon germanium mandrels.

11. The semiconductor device as recited in claim 6, further comprising a mask layer formed over the one or more mandrels.

12. The semiconductor device as recited in claim 6, wherein the one or more mandrels include one or more fins.

13. The semiconductor device of claim 6, wherein the semiconductor substrate is comprised of bulk silicon, germanium, gallium, arsenide, semiconductor on insulator (SOI) or a combination thereof.

14. The semiconductor device of claim 6, wherein the dielectric layer is comprised of silicon oxide.

15. The semiconductor device of claim 6, wherein the dielectric layer has a thickness of 20 nm or less.

* * * * *